(12) United States Patent
Yuzawa

(10) Patent No.: US 7,208,840 B2
(45) Date of Patent: Apr. 24, 2007

(54) SEMICONDUCTOR MODULE, ELECTRONIC DEVICE AND ELECTRONIC EQUIPMENT, AND METHOD FOR MANUFACTURING SEMICONDUCTOR MODULE

(75) Inventor: Hideki Yuzawa, Tida (JP)

(73) Assignee: Seiko Epson Corporation (JP)

( * ) Notice: Subject to any disclaimer, the term of this patent is extended or adjusted under 35 U.S.C. 154(b) by 291 days.

(21) Appl. No.: 10/863,808

(22) Filed: Jun. 8, 2004

(65) Prior Publication Data

US 2005/0009219 A1 Jan. 13, 2005

(30) Foreign Application Priority Data

Jun. 9, 2003 (JP) .............................. 2003-163829

(51) Int. Cl.
*H01L 23/48* (2006.01)
*H01L 23/495* (2006.01)

(52) U.S. Cl. ................ 257/777; 257/784; 257/672; 257/676; 257/690; 257/689; 257/797; 257/674; 257/E23.179

(58) Field of Classification Search ................ 257/777, 257/784, 672, 676, 690, 689, E23.179, 797, 257/674

See application file for complete search history.

(56) References Cited

U.S. PATENT DOCUMENTS 6,858,565 B2 2/2005 Fujita et al.

6,897,567 B2 * 5/2005 Horie .......................... 257/779
2003/0147580 A1 * 8/2003 Worley ......................... 385/14
2005/0012224 A1 1/2005 Yuzawa

FOREIGN PATENT DOCUMENTS

| JP | 03-200223 | 9/1991 |
|---|---|---|
| JP | 7-211742 A | 8/1995 |
| JP | 07-335692 | 12/1995 |
| JP | 8-162503 A | 6/1996 |
| JP | 10-107068 A | 4/1998 |
| JP | 2003-46212 | 2/2003 |
| JP | 2003-54138 A | 2/2003 |
| JP | 2003-197682 | 7/2003 |
| JP | 2003-263117 A | 9/2003 |
| JP | 2004-200376 | 7/2004 |
| JP | 2005-5306 A | 1/2005 |

OTHER PUBLICATIONS

Examination result issued in corresponding Japanese application.

* cited by examiner

*Primary Examiner*—Kenneth Parker
*Assistant Examiner*—Joseph Nguyen
(74) *Attorney, Agent, or Firm*—Harness, Dickey & Pierce, P.L.C.

(57) ABSTRACT

First alignment marks are provided on a film substrate in a manner that they are located at positions offset from the disposed positions of second alignment marks provided on a semiconductor chip. The amount of expansion or contraction of the film substrate is obtained by measuring the distance between the first alignment marks. Based on the amount of expansion or contraction, the semiconductor chip is shifted with respect to the film substrate and mounted thereon.

12 Claims, 2 Drawing Sheets

SEMICONDUCTOR MODULE, ELECTRONIC DEVICE AND ELECTRONIC EQUIPMENT, AND METHOD FOR MANUFACTURING SEMICONDUCTOR MODULE

RELATED APPLICATIONS

This application claims priority to Japanese Patent Application No. 2003-163829 filed Jun. 9, 2003 which is hereby expressly incorporated by reference herein in its entirety.

BACKGROUND

1. Technical Field of the Invention

The present invention relates to semiconductor modules, electronic devices and electronic equipment, and methods for manufacturing semiconductor modules, and in particular, is preferably applied when radially extending lead electrodes are used.

2. Conventional Technology

Concerning conventional semiconductor modules, for example, Japanese Laid-open Patent Application HEI 7-335692 describes a method for mounting a semiconductor chip on a film substrate by bonding protruded electrodes onto lead electrodes formed on the film substrate.

However, with the conventional semiconductor module, when the protruded electrodes are connected to the lead electrodes that radially extend, alignment marks provided at the same positions on the semiconductor chip and on the film substrate are referenced to one another to thereby align the position of the semiconductor chip with respect to the film substrate. For this reason, in conventional semiconductor devices, there is a problem in that placement positions of the alignment marks are restricted, and the alignment marks become hidden from sight and cannot be viewed when the semiconductor chip is mounted on the film substrate.

Accordingly, it is an object of the present invention to provide semiconductor modules, electronic devices and electronic equipment, and a method for manufacturing semiconductor modules, in which protruded electrodes can be connected to radially extending lead electrodes without being limited by the disposed positions of alignment marks.

SUMMARY

To solve the aforementioned problems, a semiconductor module in accordance with an embodiment of the present invention is characterized in comprising: a circuit substrate having radially extending lead electrodes formed thereon; a semiconductor chip provided with protruded electrodes connected to the lead electrodes; first alignment marks formed on the semiconductor chip; and second alignment marks formed on the circuit substrate and disposed at positions different from (offset from) the first alignment marks.

Consequently, the alignment marks can be formed on the circuit substrate in a manner to avoid a region where the semiconductor chip is mounted. For this reason, when the semiconductor chip is mounted on the circuit substrate, the problem in which the alignment marks formed on the circuit substrate are hidden from sight and cannot be viewed can be prevented, and the protruded electrodes can be connected to the radially extending lead electrodes without being restricted by the disposed positions of the alignment marks.

Also, an electronic device in accordance with an embodiment of the present invention is characterized in comprising: a circuit substrate having radially extending lead electrodes formed thereon; an electronic component provided with protruded electrodes connected to the lead electrodes; first alignment marks formed on the electronic component; and second alignment marks formed on the circuit substrate and disposed at positions different from (offset from) the first alignment marks.

Consequently, the alignment marks can be formed on the circuit substrate in a manner to avoid a region where the electronic component is mounted. For this reason, when the electronic component is mounted on the circuit substrate, the problem in which the alignment marks formed on the circuit substrate are hidden from sight and cannot be viewed can be prevented, and the protruded electrodes can be connected to the radially extending lead electrodes without being restricted by the disposed positions of the alignment marks.

Also, an electronic equipment in accordance with an embodiment of the present invention is characterized in comprising: a circuit substrate having radially extending lead electrodes formed thereon; a semiconductor chip provided with protruded electrodes connected to the lead electrodes; first alignment marks formed on the semiconductor chip; second alignment marks formed on the circuit substrate and disposed at positions different from (offset from) the first alignment marks; and an electronic component connected to the semiconductor chip through the lead electrodes.

In this way, the protruded electrodes can be accurately connected to the radially extending lead electrodes without being restricted by the disposed positions of the alignment marks, the electronic equipment can be reduced in size and weight, and the reliability of the electronic equipment can be improved.

Also, a method for manufacturing a semiconductor module in accordance with an embodiment of the present invention is characterized in comprising: a step of measuring an expansion or contraction amount between first alignment marks provided on a semiconductor chip; a step of measuring an expansion or contraction amount between second alignment marks provided on a circuit substrate; a step of calculating a placement position of the semiconductor chip with respect to the circuit substrate based on the expansion or contraction amount between the first alignment marks and the expansion or contraction amount between the second alignment marks; and a step of mounting the semiconductor chip on the circuit substrate based on a result of the calculation.

Accordingly, even when the semiconductor chip and the circuit substrate are expanded or contracted, a placement position of the semiconductor chip with respect to the circuit substrate can be determined by measuring the distance between the alignment marks. For this reason, even when the first alignment marks formed on the semiconductor chip and the second alignment marks formed on the circuit substrate are disposed at mutually different positions, the semiconductor chip can be accurately mounted on the circuit substrate, and the protruded electrodes can be connected to the radially extending lead electrodes without being restricted by the disposed positions of the alignment marks, such that the degree of freedom in the layout design can be improved.

DETAILED DESCRIPTION

A semiconductor module and a method for manufacturing the same in accordance with embodiments of the present invention will be described below with reference to the accompanying drawings.

Figure 1:
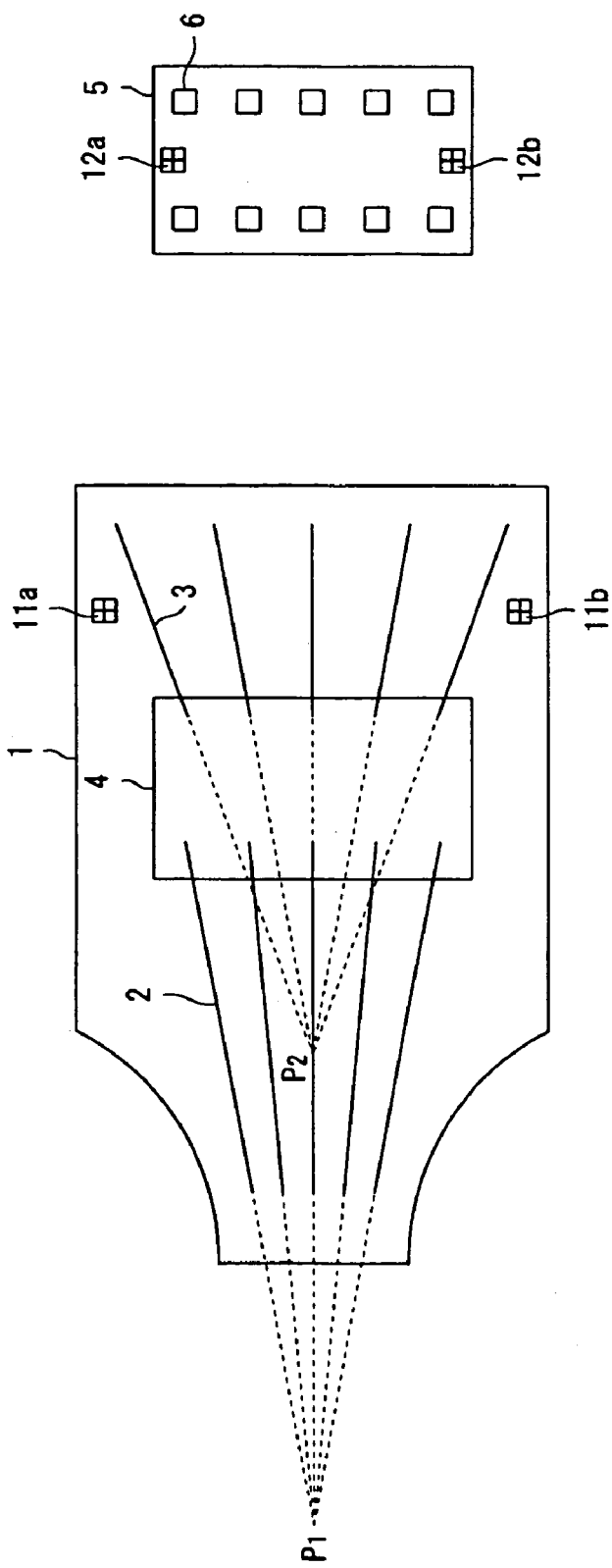
FIG. 1 is an exploded view of the structure of a semiconductor module in accordance with an embodiment of the present invention.

FIG. 1 shows a plan view illustrating an outline structure of a semiconductor module in accordance with an embodiment of the present invention.

In FIG. 1, a film substrate 1 is provided with a semiconductor chip mounting region 4, and lead electrodes 2 and 3 formed in a manner to extend respectively across the semiconductor chip mounting region 4. Here, the lead electrodes 2 that extend across one end of the semiconductor chip mounting region 4 radially extend on the film substrate 1 with a virtual center point P1 as their center, and the lead electrodes 3 that extend across the other end of the semiconductor chip mounting region 4 radially extend on the film substrate 1 with a virtual center point P2 as their center.

Also, a semiconductor chip 5 includes protruded electrodes 6 formed thereon. By bonding the protruded electrodes 6 formed on the semiconductor chip 5 onto the lead electrodes 2 and 3, the semiconductor chip 5 can be mounted on the film substrate 1.

Since the lead electrodes 2 and 3 on the film substrate 1 are formed in a manner to radially extend, the accuracy in aligning the lead electrodes 2 and 3 with the protruded electrodes 6 can be improved, even when the arrangement pitches of the lead electrodes 2 and 3 change due to expansion or contraction of the film substrate 1 which may be caused by heat and/or humidity.

Also, the film substrate 1 is provided thereon with alignment marks 11a and 11b, and the semiconductor chip 5 is provided thereon with alignment marks 12a and 12b. The placement positions of the alignment marks 11a and 11b provided on the film substrate 1 can be made different from (offset from) the placement positions of the alignment marks 12a and 12b provided on the semiconductor chip 5.

Accordingly, the alignment marks 11a and 11b can be formed on the film substrate 1 in a manner to avoid the semiconductor chip mounting region 4. For this reason, when the semiconductor chip 5 is mounted on the film substrate 1, and when resin for underfill is coated on the semiconductor chip mounting region 4, the problem in which the alignment marks 11a and 11b formed on the film substrate 1 are hidden from sight and cannot be viewed can be avoided, and therefore the protruded electrodes 6 can be connected to the radially extending lead electrodes 2 and 3 without being restricted by the disposed positions of the alignment marks 11a and 11b.

Figure 2:
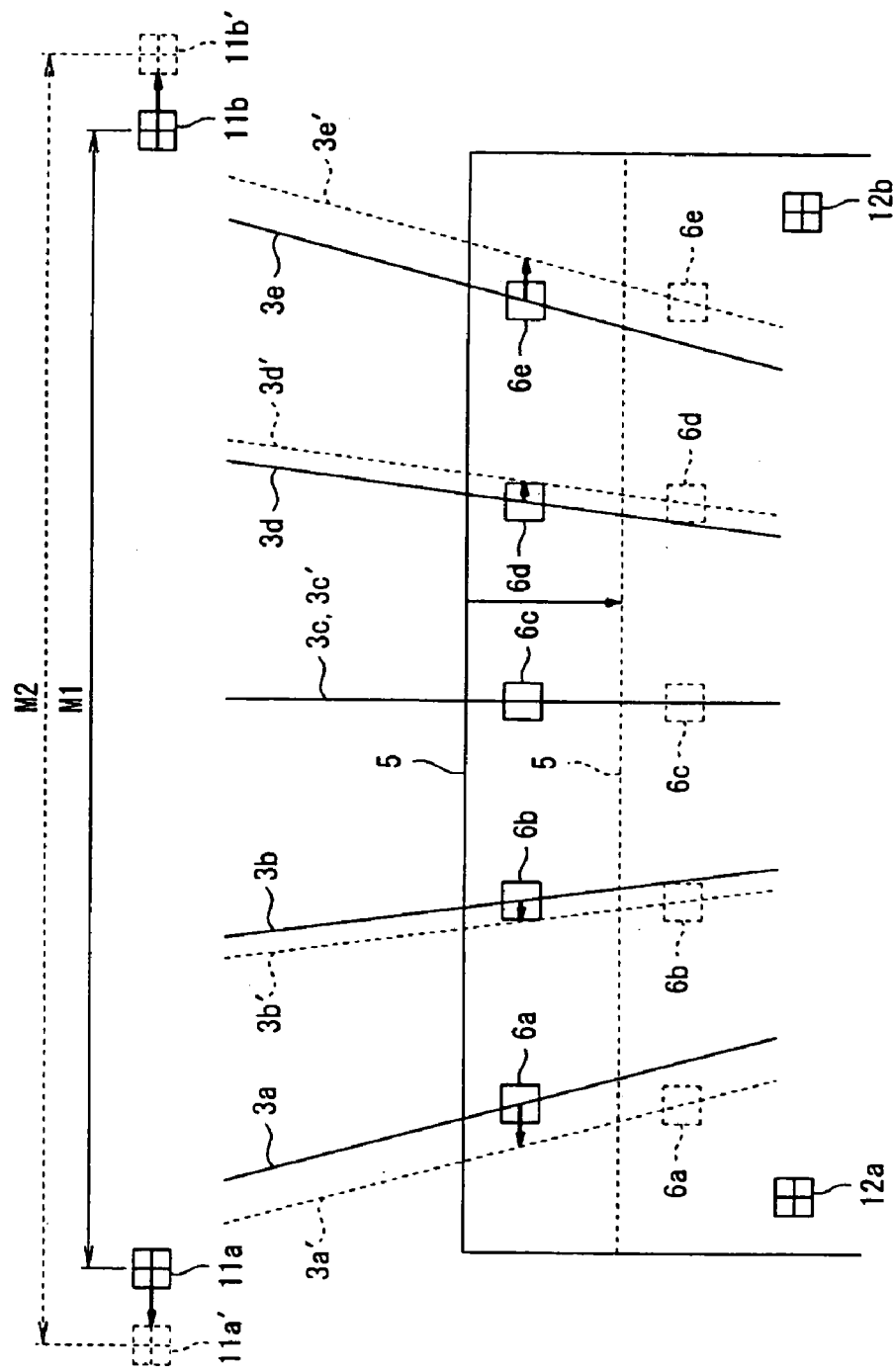
FIG. 2 is a plan view indicating a method for disposing a semiconductor chip.

FIG. 2 is a plan view indicating a method for placing the semiconductor chip 5 on the film substrate 1 having the lead electrodes 2 and 3 shown in FIG. 1 formed thereon.

In FIG. 2, the film substrate 1 of FIG. 1 includes lead electrodes 3a–3e formed thereon; wherein the lead electrodes 3a–3e are assumed to extend radially on the film substrate 1 with the virtual center point P2 of FIG. 1 as their center. Also, the semiconductor chip 5 is provided with protruded electrodes 6a–6e, which are assumed to be placed corresponding to arrangement pitches of the lead electrodes 3a–3e of the film substrate 1. When no expansion or contraction occurs in the film substrate 1, the arrangement pitches of the lead electrodes 3a–3e do not change. For this reason, by positioning the semiconductor chip 5 such that the protruded electrodes 6a–6e are respectively disposed on the lead electrodes 3a–3e, the semiconductor chip 5 can be mounted on the film substrate 1.

On the other hand, if the film substrate 1 expands due to heat and/or humidity or the like, the arranged pitches of the lead electrodes 3a–3e change, and the positions of the lead electrodes 3a–3e shift to positions of the lead electrodes indicated as 3a'–3e'. Here, since the lead electrodes 3a–3e extend radially, the lead electrodes 3a'–3e' maintains the state in which they extend radially on the film substrate 1 with the point P2 of FIG. 1 as their center, even when the film substrate 1 expands.

When the positions of the lead electrodes 3a–3e shift to the positions of the lead electrodes indicated as 3a'–3e', the position of the semiconductor chip 5 is shifted along the extending direction of the lead electrodes 3a'–3e'. Since the lead electrodes 3a'–3e' extend radially, by shifting the position of the semiconductor chip 5 along the extending direction of the lead electrodes 3a'–3e', the semiconductor chip 5 can be positioned such that the protruded electrodes 6a–6e are respectively disposed on the lead electrodes 3a'–3e', and the semiconductor chip 5 can be mounted on the film substrate 1.

Here, when the semiconductor chip is to be disposed on the film substrate 1, the amount of expansion or contraction of the film substrate 1 is obtained through measuring the distance between the alignment marks 11a and 11b. Then, expansion or contraction between the alignment marks 11a and 11b is assumed to be expansion or contraction only in a direction in which the lead electrodes 3a–3e are arranged, the amount of which the semiconductor chip 5 is to be shifted is calculated using a proportional conversion based on the amount of expansion or contraction of the film substrate 1, and the semiconductor chip 5 is shifted from the designed placement position and disposed on the film substrate 1.

In other words, if the film substrate 1 expands, the designed positions of the alignment marks 11a and 11b shift to positions of the alignment marks indicated as 11a' and 11b'. Accordingly, when the designed distance between the alignment marks 11a and 11b is M1, the expansion of the film substrate 1 changes the distance between the alignment marks 11a' and 11b' to M2.

Expansion or contraction of the film substrate 1 in an area thereof with respect to the virtual center point P2 is proportional to the distance between the area and the virtual center point P2. Accordingly, based on the amount of expansion of the film substrate 1 between the alignment marks 11a and 11b, expansion of the film substrate 1 at the disposed positions of the lead electrodes 3a'–3e' along a direction connecting the outermost ends of the lead electrodes 3a'–3e' with respect to the virtual center point P2 is obtained, and the obtained value is divided along a cumulative direction in which the lead electrodes 3a'–3e' are arranged. When the expansion of the film substrate 2 at the disposed positions of the lead electrodes 3a'–3e' is obtained, the semiconductor chip 5 is shifted in a direction opposite to the expansion direction of the film substrate 1 to a position where the lead electrodes 3a'–3e' come closer to one another, and the protruded electrodes 6a–6e are connected onto the lead electrodes 3a'–3e'.

As a consequence, even when the semiconductor chip 5 and the film substrate 1 expand or contract, the placement position of the semiconductor chip 5 with respect to the film substrate 1 can be calculated by measuring the distance between the alignment marks 11a and 11b and between the alignment marks 12a and 12b. For this reason, even when the disposed positions of the alignment marks 12a and 12b formed on the semiconductor chip 5 and those of the alignment marks 11a and 11b formed on the film substrate 1 are different from one another, the semiconductor chip 5 can be accurately mounted on the film substrate 1, the protruded electrodes 6a–6e can be connected to the radially extending lead electrodes 3a'–3e' without being restricted by the disposed positions of the alignment marks 11a and 11b, such that the degree of freedom in the layout design of the film substrate 1 and/or the semiconductor chip 5 can be improved.

It is noted that, in the embodiment in FIG. 1, the method in which the lead electrodes 2 and 3 are formed on the film substrate 1 is described. However, instead of the film substrate 1, another substrate, such as, for example, a printed circuit board, a multiple-layered wiring substrate, a build-up substrate, a tape substrate or a glass substrate may be used. Also, the material of the substrate on which the lead electrodes 2 and 3 are formed may be, for example, polyimide resin, glass-epoxy resin, BT resin, a composite of aramid and epoxy, ceramics or the like. Also, as the protruded electrodes 6a–6e, for example, Au bumps, Au/Ni bumps, Cu bumps or Ni bumps coated with solder material, solder balls or the like can be used. Also, as the lead electrodes 2 and 3, for example, copper (Cu), iron (Fe), gold (Au), silver (Ag), copper (Cu) coated with solder material, copper (Cu) coated with gold (Au) or the like can be used.

Also, for connecting the protruded electrodes 6a–6e to the lead electrodes 3a–3e, for example, metal bonding such as solder bonding or alloy bonding may be used, or another pressure bonding such as ACF (Anisotropic Conductive Film) bonding, NCF (Nonconductive Film) bonding, ACP (Anisotropic Conductive Paste) bonding, NCP (Nonconductive Paste) bonding or the like may be used. Also, in the embodiment described above, the method is described with the protruded electrodes 6a–6e that are linearly arranged. However, the protruded electrodes 6a–6e can be arranged in a staggered fashion.

Also, in the embodiment described above, the description is made, using a COF (chip on film) as an example. However, the present invention may also be applied to others including TCP (tape carrier package), COG (chip on glass) and TCM (tape carrier module).

Further, the semiconductor device described above is applicable to electronic equipment, such as, for example, liquid crystal display devices, portable telephones, portable information terminals, video cameras, digital cameras, MD (Mini Disc) players, the electronic equipment can be further reduced in size and weight, and the reliability of the electronic equipment can be improved.

Also, in the embodiment described above, although the description is made using the method for mounting a semiconductor chip on a circuit substrate as an example, the present invention is not necessarily limited to the method for mounting a semiconductor chip. For example, a ceramic element such as a surface acoustic wave (SAW) element, an optical element such as an optical modulator, an optical switch or the like, or any of a variety of sensors such as a magnetic sensor, a bio-sensor and the like may be mounted.

What is claimed is:

1. A semiconductor module comprising:
   a circuit substrate having a first surface and a plurality of first lead electrodes formed on the first surface, the first lead electrodes being oriented along directions intersecting a first virtual point, each of the first lead electrodes having a first end and a second end, the second ends of each of the first lead electrodes being disposed closer to the first virtual point than the first ends and being disposed closer to the other of the first lead electrodes than the first ends;
   a semiconductor chip provided with protruded electrodes connected to the first lead electrodes;
   first alignment marks on the semiconductor chip; and
   second alignment marks on the first surface of the circuit substrate, the second alignment marks being disposed at positions offset from the first alignment marks.

2. The semiconductor module of claim 1, wherein the circuit substrate further includes a plurality of second lead electrodes formed on the first surface, the second lead electrodes being oriented along directions intersecting a second virtual point, each of the second lead electrodes having a first end and a second end, the second ends of each of the second lead electrodes being disposed closer to the second virtual point than the first ends and being disposed closer to the other of the second lead electrodes than the first ends, and
   the semiconductor chip is provided with protruded electrodes connected to the second lead electrodes.

3. The semiconductor module of claim 2, wherein the circuit substrate has a mounting region defined on the first surface, the first ends of the first lead electrodes overlapping the mounting region, the second ends of the second lead electrodes overlapping the mounting region.

4. The semiconductor module of claim 1, wherein the circuit substrate has a mounting region defined on the first surface, and the second alignment marks are disposed outside of the mounting region.

5. An electronic device comprising:
   a circuit substrate having a first surface and a plurality of first lead electrodes formed on the first surface, the first lead electrodes being oriented along directions intersecting a first virtual point, each of the first lead electrodes having a first end and a second end, the second ends of each of the first lead electrodes being disposed closer to the first virtual point than the first ends and being disposed closer to the other of the first lead electrodes than the first ends;
   an electronic component provided with protruded electrodes connected to the first lead electrodes;
   first alignment marks on the electronic component; and
   second alignment marks on the first surface of the circuit substrate, the second alignment marks being disposed at positions offset from the first alignment marks.

6. The electronic device of claim 5, wherein the circuit substrate further includes a plurality of second lead electrodes formed on the first surface, the second lead electrodes being oriented along directions intersecting a second virtual point, each of the second lead electrodes having a first end and a second end, the second ends of each of the second lead electrodes being disposed closer to the second virtual point than the first ends and being disposed closer to the other of the second lead electrodes than the first ends, and
   the semiconductor chip is provided with protruded electrodes connected to the second lead electrodes.

7. The electronic device of claim 6, wherein the circuit substrate has a mounting region defined on the first surface, the first ends of the first lead electrodes overlapping the mounting region, the second ends of the second lead electrodes overlapping the mounting region.

8. The electronic device of claim 5, wherein the circuit substrate has a mounting region defined on the first surface, and the second alignment marks are disposed outside of the mounting region.

9. An electronic equipment comprising:
   a circuit substrate having a first surface and a plurality of first lead electrodes formed on the first surface, the first lead electrodes being oriented along directions intersecting a first virtual point, each of the first lead electrodes having a first end and a second end, the second ends being disposed closer to the first virtual point than the first ends, the second end of each of the first lead electrodes being disposed closer to the other of the first lead electrodes than the first end;

a semiconductor chip provided with protruded electrodes connected to the first lead electrodes;

first alignment marks on the semiconductor chip;

second alignment marks on the first surface of the circuit substrate, the second alignment marks being disposed at positions offset from the first alignment marks; and an electronic component connected to the semiconductor chip through the first lead electrodes.

10. The electronic equipment of claim 9, wherein the circuit substrate further includes a plurality of second lead electrodes formed on the first surface, the second lead electrodes being oriented along directions intersecting a second virtual point, each of the second lead electrodes having a first end and a second end, the second ends of each of the second lead electrodes being disposed closer to the second virtual point than the first ends and being disposed closer to the other of the second lead electrodes than the first ends, the semiconductor chip is provided with protruded electrodes connected to the second lead electrodes, and the electronic component is connected to the semiconductor chip through the second lead electrodes.

11. The electronic equipment of claim 10, wherein the circuit substrate has a mounting region defined on the first surface, the first ends of the first lead electrodes overlapping the mounting region, the second ends of the second lead electrodes overlapping the mounting region.

12. The electronic equipment of claim 9, wherein the circuit substrate has a mounting region defined on the first surface, and the second alignment marks are disposed outside of the mounting region.

* * * * *